(12) United States Patent
Brubaker et al.

(10) Patent No.: US 11,929,447 B2
(45) Date of Patent: Mar. 12, 2024

(54) ANNEALING MATERIALS AND METHODS FOR ANNEALING PHOTOVOLTAIC DEVICES WITH ANNEALING MATERIALS

(71) Applicant: First Solar, Inc., Tempe, AZ (US)

(72) Inventors: Joshua Brubaker, Gibsonburg, OH (US); Joan King, Toledo, OH (US); Benjamin Milliron, Sylvania, OH (US); Jay Norman, Perrysburg, OH (US); Jason Robinson, Perrysburg, OH (US); John Tumbush, Sylvania, OH (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 16/980,346

(22) PCT Filed: Mar. 12, 2019

(86) PCT No.: PCT/US2019/021759
§ 371 (c)(1),
(2) Date: Sep. 11, 2020

(87) PCT Pub. No.: WO2019/178029
PCT Pub. Date: Sep. 19, 2019

(65) Prior Publication Data
US 2021/0043794 A1  Feb. 11, 2021

Related U.S. Application Data

(60) Provisional application No. 62/642,192, filed on Mar. 13, 2018.

(51) Int. Cl.
*H01L 31/18* (2006.01)

(52) U.S. Cl.
CPC ...... *H01L 31/1864* (2013.01); *H01L 31/1832* (2013.01); *H01L 31/1836* (2013.01)

(58) Field of Classification Search
CPC ......... H01L 31/0296–02966; H01L 31/03925; H01L 31/073; H01L 31/1828–1836; H01L 31/1832; H01L 31/1864
See application file for complete search history.

(56) References Cited

U.S. PATENT DOCUMENTS

| 5,994,642 A | 11/1999 | Higuchi et al. |
| 7,858,872 B2 | 12/2010 | Hotz et al. |

(Continued)

FOREIGN PATENT DOCUMENTS

| JP | H07147421 A | 6/1995 |
| JP | H104205 A | 1/1998 |

(Continued)

OTHER PUBLICATIONS

Niles, et al., "Chemical reactivity of CdCl2 wet-deposited on CdTe films studied by X-ray photoelectron spectroscopy." Applied Surface Science 136.3 (1998): 221-229.*

(Continued)

*Primary Examiner* — Bethany L Martin
(74) *Attorney, Agent, or Firm* — MacMillan, Sobanski & Todd, LLC

(57) ABSTRACT

A method for annealing an absorber layer is disclosed, the method including contacting a surface of the absorber layer with an annealing material provided as a gel. The annealing material comprises cadmium chloride and a thickening agent. A viscosity of the gel of the annealing material is greater than or equal to 5 millipascal seconds.

12 Claims, 7 Drawing Sheets

(56) References Cited

U.S. PATENT DOCUMENTS

| | | | |
|---|---|---|---|
| 8,631,757 B2 | 1/2014 | Roussillon et al. | |
| 2010/0184249 A1 | 7/2010 | Chen | |
| 2011/0143492 A1* | 6/2011 | DeLuca | H01L 31/073 438/84 |
| 2011/0315221 A1* | 12/2011 | Hunt | H01L 31/0368 136/258 |
| 2012/0258240 A1* | 10/2012 | Rebstock | H01L 31/1828 427/74 |
| 2013/0130433 A1* | 5/2013 | Gupta | C23C 14/24 438/95 |
| 2014/0051237 A1* | 2/2014 | Lockett | H01L 31/035218 438/502 |
| 2014/0124030 A1* | 5/2014 | Inaki | H01L 31/03925 136/256 |
| 2014/0227826 A1 | 8/2014 | Foust | |
| 2016/0032141 A1* | 2/2016 | Maghsoodi | H01L 31/02168 428/220 |
| 2017/0008022 A1* | 1/2017 | deVos | B05C 5/0258 |
| 2017/0170353 A1 | 6/2017 | Jin et al. | |
| 2019/0019953 A1 | 1/2019 | Brohan et al. | |

FOREIGN PATENT DOCUMENTS

| | | |
|---|---|---|
| JP | H10506840 A | 7/1998 |
| JP | H10303441 A | 11/1998 |
| JP | H11251607 A | 9/1999 |
| JP | 2005148239 A | 6/2005 |
| JP | 2007263622 A | 10/2007 |
| JP | 2011515852 A | 5/2011 |
| JP | 2011518942 A | 6/2011 |
| JP | 2015008181 A | 1/2015 |
| JP | 2015035594 A | 2/2015 |
| WO | 9611069 | 4/1996 |
| WO | 2009117072 A1 | 9/2009 |
| WO | 2014036489 A1 | 3/2014 |
| WO | 2017121830 A1 | 7/2017 |

OTHER PUBLICATIONS

Kaelin, et al. "Low-cost CIGS solar cells by paste coating and selenization." Thin Solid Films 480 (2005): 486-490.*

International Preliminary Report on Patentability, Application No. PCT/US2019/021759, dated Sep. 15, 2020.

Kumar et al., "Faster photoresponse, enhanced photosensitivity and photoluminescence in nanocrystalline ZnO films suitably doped by Cd", Journal of Alloys and Compounds, (2017), vol. 706, pp. 438-446.

PCT International Search Report and Written Opinion, Application No. PCT/US2019/021759, dated May 14, 2019.

Japanese Office Action, dated Mar. 12, 2021, Japanese Application No. 2020-547214.

Rose et al., "Technology Support for High-Throughput Processing of Thin-Film CdTe PV Modules, Annual Technical Report, Phase II, Apr. 1, 1999-Mar. 31, 2000," NREL, Jan. 2001.

Japanese Notification of Decision of Rejection, Application No. 2020-0547214, dated Jun. 2, 2022.

Japanese Decision of Dismissal of Amendment, Application No. 2020-547214, dated Jun. 2, 2022.

Indian First Examination Report, Application No. 202017042082, dated Jun. 7, 2022.

First Chinese Office Action, Application No. 201980032088.6, dated Jun. 8, 2023.

Japanese Notification of Reason(s) for Rejection, dated Oct. 11, 2023, Application No. 2022-159353.

* cited by examiner

ANNEALING MATERIALS AND METHODS FOR ANNEALING PHOTOVOLTAIC DEVICES WITH ANNEALING MATERIALS

CROSS-REFERENCE TO RELATED APPLICATIONS

This is a national phase application of international application PCT/US2019/021759, filed Mar. 12, 2019, and claims the benefit of U.S. Application 62/642,192, filed under 35 U.S.C. § 111(b) on Mar. 13, 2018; each of which is incorporated by reference in the entirety.

BACKGROUND

The present specification generally relates to annealing materials and methods for annealing an absorber layer using the annealing materials and, more specifically, methods for annealing an absorber layer using an annealing material applied as a gel.

A photovoltaic device generates electrical power by converting light into electricity using semiconductor materials that exhibit the photovoltaic effect. The semiconductor material can be annealed to activate dopants, recrystallize polycrystalline semiconductor material, and to increase grain size of the semiconductor material. A cadmium chloride based solution can be applied to the semiconductor material such as, for example, a semiconductor material comprising cadmium and tellurium. However, spray application of the solution can be difficult to contain due to atomization. Additionally, the solution may not be conducive to even application, which can lead to defect formation.

Accordingly, a need exists for alternative annealing materials and methods for annealing absorber layers.

SUMMARY

The embodiments provided herein relate to methods for doping photovoltaic devices with group V dopants. These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of a photovoltaic device for generating electrical power from light are described herein. The photovoltaic device generally includes an absorber layer formed from a semiconductor material. The absorber layer can be subjected to one or more processing steps configured to dope the absorber layer with a group V dopant such as, for example, arsenic or phosphorous. Various embodiments of methods for doping an absorber layer with group V dopants will be described in more detail herein.

Figure 1:
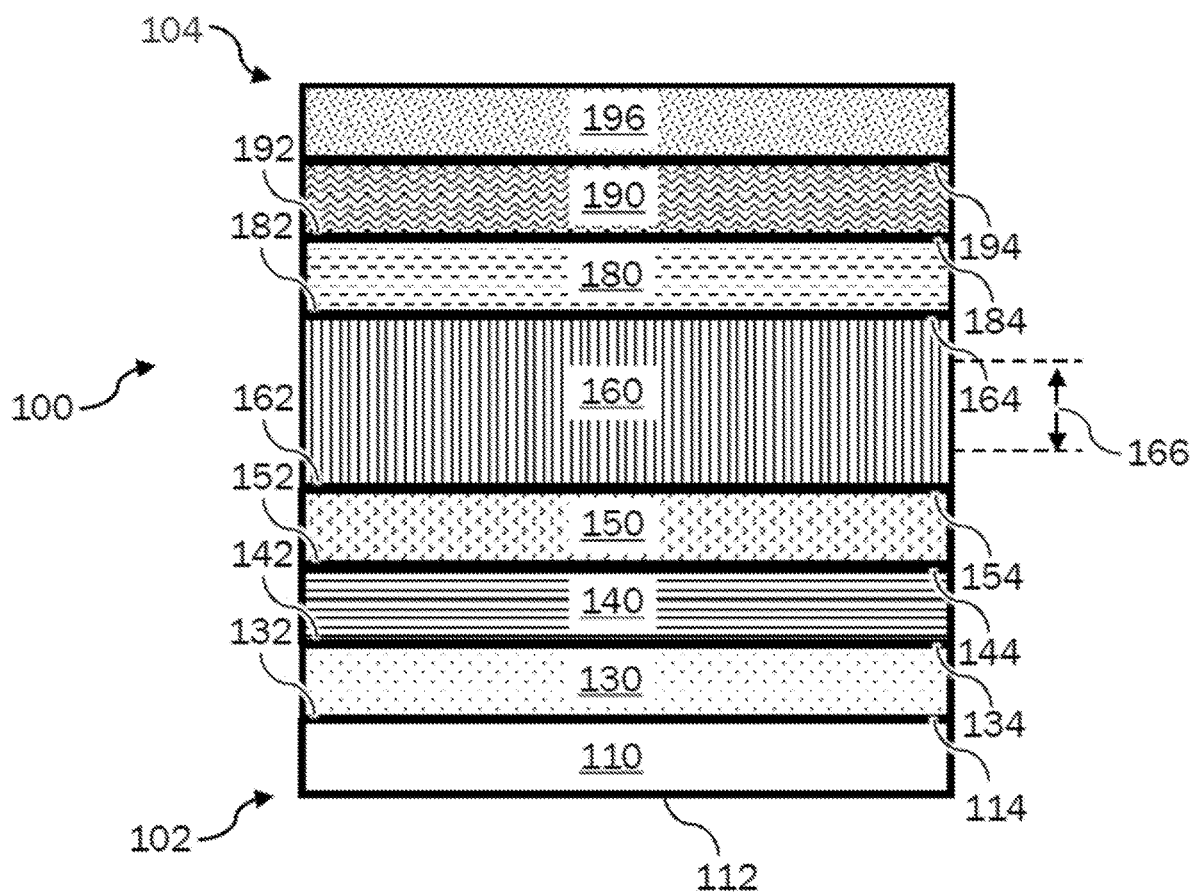
FIG. 1 schematically depicts a photovoltaic device according to one or more embodiments shown and described herein.

Referring now to FIG. 1, an embodiment of a photovoltaic device 100 is schematically depicted. The photovoltaic device 100 can be configured to receive light and transform light into electrical signals, e.g., photons can be absorbed from the light and transformed into electrical signals via the photovoltaic effect. Accordingly, the photovoltaic device 100 can define an energy side 102 configured to be exposed to a light source such as, for example, the sun. The photovoltaic device 102 can also define an opposing side 104 offset from the energy side 102. It is noted that the term "light" can refer to various wavelengths of the electromagnetic spectrum such as, but not limited to, wavelengths in the ultraviolet (UV), infrared (IR), and visible portions of the electromagnetic spectrum. The photovoltaic device 100 can include a plurality of layers disposed between the energy side 102 and the opposing side 104. As used herein, the term "layer" refers to a thickness of material provided upon a surface. Each layer can cover all or any portion of the surface.

Figure 2:
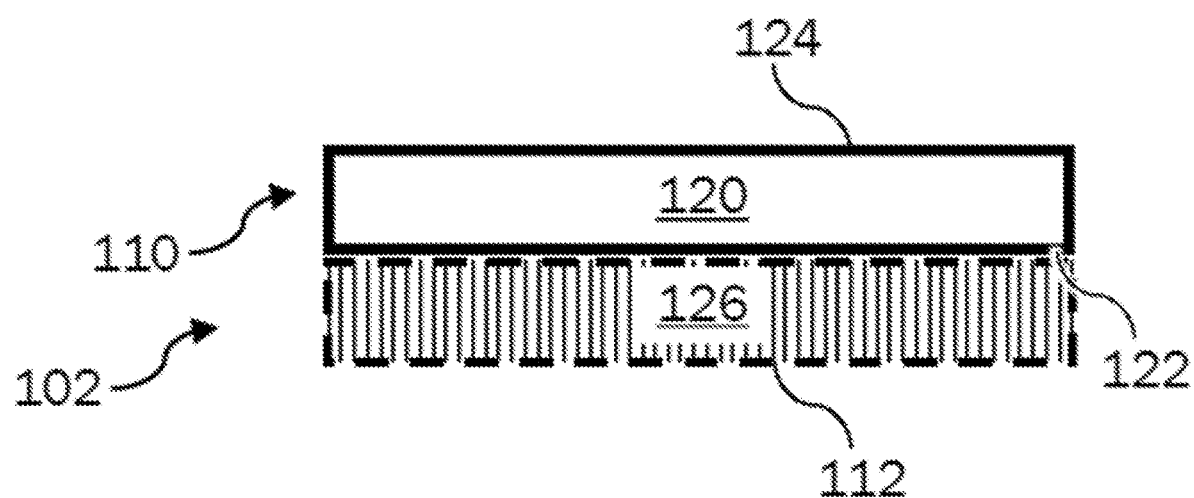
FIG. 2 schematically depicts a substrate according to one or more embodiments shown and described herein.

The photovoltaic device 100 can include a substrate 110 configured to facilitate the transmission of light into the photovoltaic device 100. The substrate 110 can be disposed at the energy side 102 of the photovoltaic device 100. Referring collectively to FIGS. 1 and 2, the substrate 110 can have a first surface 112 substantially facing the energy side 102 of the photovoltaic device 100 and a second surface 114 substantially facing the opposing side 104 of the photovoltaic device 100. One or more layers of material can be disposed between the first surface 112 and the second surface 114 of the substrate 110.

The substrate 110 can include a transparent layer 120 having a first surface 122 substantially facing the energy side 102 of the photovoltaic device 100 and a second surface 124 substantially facing the opposing side 104 of the photovoltaic device 100. In some embodiments, the second surface 124 of the transparent layer 120 can form the second surface 114 of the substrate 110. The transparent layer 120 can be formed from a substantially transparent material such as, for example, glass. Suitable glass can include soda-lime glass, or any glass with reduced iron content. The transparent layer 120 can have any suitable transmittance, including about 250 nm to about 950 nm in some embodiments. The transparent layer 120 may also have any suitable transmission percentage, including, for example, more than about 50% in one embodiment, more than about 60% in another embodiment, more than about 70% in yet another embodiment, more than about 80% in a further embodiment, or more than about 85% in still a further embodiment. In one embodiment, transparent layer 120 can be formed from a glass with about 90% transmittance. Optionally, the substrate 110 can include a coating 126 applied to the first surface 122 of the transparent layer 120. The coating 126 can be configured to interact with light or to improve durability of the substrate 110 such as, but not limited to, an antireflective coating, an antisoiling coating, or a combination thereof.

Referring again to FIG. 1, the photovoltaic device 100 can include a barrier layer 130 configured to mitigate diffusion of contaminants (e.g. sodium) from the substrate 110, which could result in degradation or delamination. The barrier layer 130 can have a first surface 132 substantially facing the energy side 102 of the photovoltaic device 100 and a second surface 134 substantially facing the opposing side 104 of the photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that two layers are disposed contiguously and without any intervening materials between at least a portion of the layers.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 500 Å in one embodiment, more than about 750 Å in another embodiment, or less than about 1200 Å in a further embodiment.

Referring still to FIG. 1, the photovoltaic device 100 can include a transparent conductive oxide (TCO) layer 140 configured to provide electrical contact to transport charge carriers generated by the photovoltaic device 100. The TCO layer 140 can have a first surface 142 substantially facing the energy side 102 of the photovoltaic device 100 and a second surface 144 substantially facing the opposing side 104 of the photovoltaic device 100. In some embodiments, the TCO layer 140 can be provided adjacent to the barrier layer 130. For example, the first surface 142 of the TCO layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., F—$SnO_2$), indium tin oxide, or cadmium stannate.

The photovoltaic device 100 can include a buffer layer 150 configured to provide an insulating layer between the TCO layer 140 and any adjacent semiconductor layers. The buffer layer 150 can have a first surface 152 substantially facing the energy side 102 of the photovoltaic device 100 and a second surface 154 substantially facing the opposing side 104 of the photovoltaic device 100. In some embodiments, the buffer layer 150 can be provided adjacent to the TCO layer 140. For example, the first surface 152 of the buffer layer 150 can be provided upon the second surface 144 of the TCO layer 140. The buffer layer 140 may include material having higher resistivity than the TCO later 140, including, but not limited to, intrinsic tin dioxide, zinc magnesium oxide (e.g., $Zn_{1-x}Mg_xO$), silicon dioxide ($SnO_2$), aluminum oxide ($Al_2O_3$), aluminum nitride (AlN), zinc tin oxide, zinc oxide, tin silicon oxide, or any combination thereof. In some embodiments, the material of the buffer layer 140 can be configured to substantially match the band gap of an adjacent semiconductor layer (e.g., an absorber). The buffer layer 150 may have any suitable thickness between the first surface 152 and the second surface 154, including, for example, more than about 100 Å in one embodiment, between about 100 Å and about 800 Å in another embodiment, or between about 150 Å and about 600 Å in a further embodiment.

Referring again to FIG. 1, the photovoltaic device 100 can include an absorber layer 160 configured to cooperate with another layer and form a p-n junction within the photovoltaic device 100. Accordingly, absorbed photons of the light can free electron-hole pairs and generate carrier flow, which can yield electrical power. The absorber layer 160 can have a first surface 162 substantially facing the energy side 102 of the photovoltaic device 100 and a second surface 164 substantially facing the opposing side 104 of the photovoltaic device 100. A thickness of the absorber layer 160 can be defined between the first surface 162 and the second surface 164. The thickness of the absorber layer 160 can be between about 0.5 µm to about 10 µm such as, for example, between about 1 µm to about 7 µm in one embodiment, or between about 2 µm to about 5 µm in another embodiment.

According to the embodiments described herein, the absorber layer 160 can be formed from a p-type semiconductor material having an excess of positive charge carriers, i.e., holes or acceptors. The absorber layer 160 can include any suitable p-type semiconductor material such as group II-VI semiconductors. Specific examples include, but are not limited to, semiconductor materials comprising from cadmium, tellurium, selenium, or any combination thereof. Suitable examples include, but are not limited to, cadmium telluride, ternaries of cadmium, selenium and tellurium (e.g., $CdSe_xTe_{1-x}$), or quaternaries comprising cadmium, selenium and tellurium. In embodiments where the absorber layer 160 comprises selenium and cadmium, the atomic percent of the selenium can be greater than about 0 atomic percent and less than about 20 atomic percent. In embodiments where the absorber layer 160 comprises tellurium and cadmium, the atomic percent of the tellurium can be greater than about 30 atomic percent and less than about 50 atomic percent. It is noted that the atomic percent described herein is representative of the entirety of the absorber layer 160, the atomic percentage of material at a particular location within the absorber layer 160 can vary with thickness compared to the overall composition of the absorber layer 160. It is noted that the concentration of tellurium, selenium, or both can vary through the thickness of the absorber layer 160. For example, when the absorber layer 160 comprises a ternary of cadmium, selenium, and tellurium ($CdSe_xTe_{1-x}$), x can vary in the absorber layer 160 with distance from the first surface 162 of the absorber layer 160. In some embodiments, the value of x can decrease in the absorber layer 160 with distance from the first surface 162 of the absorber layer 160.

According to the embodiments provided herein, the dopant within the absorber layer 160 can be activated to a desired charge carrier concentration. In some embodiments, the absorber layer 160 can be doped with a group V dopant such as, for example, nitrogen (N), phosphorous (P), arsenic (As), antimony (Sb), bismuth (Bi), ununpentium (Uup), or a combination thereof. The total dosage of the dopant within the absorber layer 160 can be controlled. In some embodiments, an atomic concentration of Group V dopant in a central region 166 of the absorber layer 160 can be greater than about $1\times10^{16}$ $cm^{-3}$ such as, for example, between about $1\times10^{17}$ $cm^{-3}$ and about $5\times10^{20}$ $cm^{-3}$ in one embodiment, between about $3\times10^{17}$ cm$^{-3}$ and about $1\times10^{19}$ cm$^3$ in another embodiment, or between about $5\times10^{17}$ cm$^{-3}$ and about $5\times10^{18}$ cm$^{-3}$ in a further embodiment. The central region 166 is the middle 50% of the absorber layer 160, which is offset by 25% of the thickness of the absorber layer 160 from each of the first surface 162 and the second surface 164 of the absorber layer 160. Alternatively or additionally, the concentration profile of the group V dopant can vary through the thickness of the absorber layer 160. Specifically, the amount of the group V dopant can vary with distance from the second surface 164 of the absorber layer 160.

Referring still to FIG. 1, the p-n junction can be formed by providing the absorber layer 160 sufficiently close to a portion of the photovoltaic device 100 having an excess of negative charge carriers, i.e., electrons or donors. In some embodiments, the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150.

Figure 3:
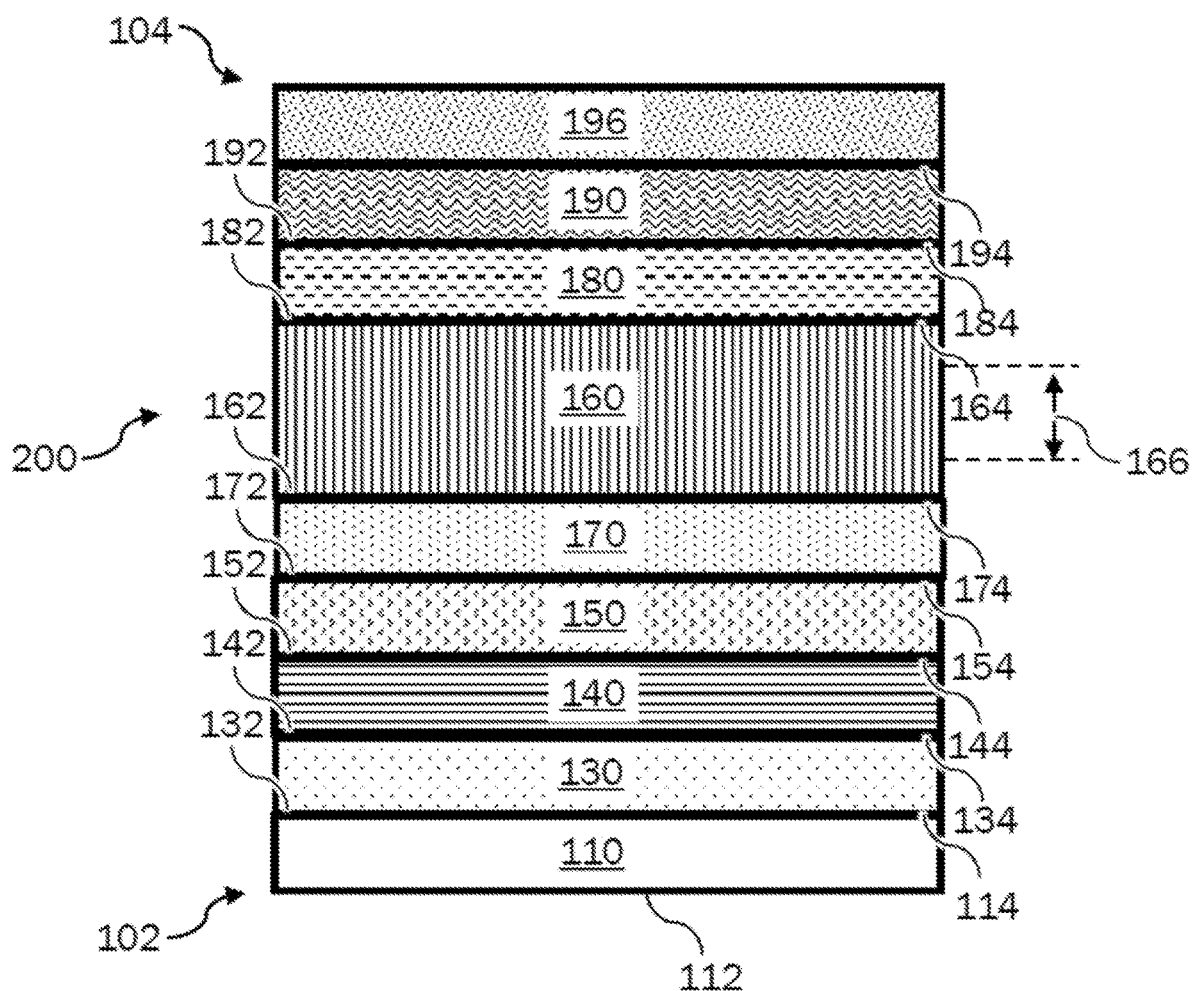
FIG. 3 schematically depicts a photovoltaic device according to one or more embodiments shown and described herein.

Referring now to FIG. 3, in some embodiments, a photovoltaic device 200 can include a window layer 170 comprising n-type semiconductor material. Aside from the window layer 170, the photovoltaic device 200 can have a substantially similar layer structure as the photovoltaic device 100 (FIG. 1). The absorber layer 160 can be formed adjacent to the window layer 170. The window layer 170 can have a first surface 172 substantially facing the energy side 102 of the photovoltaic device 200 and a second surface 174 substantially facing the opposing side 104 of the photovoltaic device 200. In some embodiments, the window layer 170 can be positioned between the absorber layer 160 and the TCO layer 140. In one embodiment, the window layer 170 can be positioned between the absorber layer 160 and the buffer layer 150. The window layer 170 can include any suitable material, including, for example, cadmium sulfide, zinc sulfide, cadmium zinc sulfide, zinc magnesium oxide, or any combination thereof.

Referring again to FIG. 1, the photovoltaic device 100 can include a back contact layer 180 configured to mitigate undesired alteration of the dopant and to provide electrical contact to the absorber layer 160. The back contact layer 180 can have a first surface 182 substantially facing the energy side 102 of the photovoltaic device 100 and a second surface 184 substantially facing the opposing side 104 of the photovoltaic device 100. A thickness of the back contact layer 180 can be defined between the first surface 182 and the second surface 184. The thickness of the back contact layer 180 can be between about 5 nm to about 200 nm such as, for example, between about 10 nm to about 50 nm in one embodiment.

In some embodiments, the back contact layer 180 can be provided adjacent to the absorber layer 160. For example, the first surface 182 of the back contact layer 180 can be provided upon the second surface 164 of the absorber layer 160. In some embodiments, the back contact layer 180 can include binary or ternary combinations of materials from groups I, II, VI, such as for example, one or more layers containing zinc, copper, cadmium and tellurium in various compositions. Further exemplary materials include, but are not limited to, zinc telluride doped with a dopant (e.g., copper telluride), or zinc telluride alloyed with copper telluride.

The photovoltaic device 100 can include a conducting layer 190 configured to provide electrical contact with the absorber layer 160. The conducting layer 190 can have a first surface 192 substantially facing the energy side 102 of the photovoltaic device 100 and a second surface 194 substantially facing the opposing side 104 of the photovoltaic device 100. In some embodiments, the conducting layer 190 can be provided adjacent to the back contact layer 180. For example, the first surface 192 of the conducting layer 190 can be provided upon the second surface 184 of the back contact layer 180. The conducting layer 190 can include any suitable conducting material such as, for example, one or more layers of nitrogen-containing metal, silver, nickel, copper, aluminum, titanium, palladium, chrome, molybdenum, gold, or the like. Suitable examples of a nitrogen-containing metal layer can include aluminum nitride, nickel nitride, titanium nitride, tungsten nitride, selenium nitride, tantalum nitride, or vanadium nitride.

The photovoltaic device 100 can include a back support 196 configured to cooperate with the substrate 110 to form a housing for the photovoltaic device 100. The back support 196 can be disposed at the opposing side 102 of the photovoltaic device 100. For example, the back support 196 can be formed adjacent to conducting layer 190. The back support 196 can include any suitable material, including, for example, glass (e.g., soda-lime glass).

Referring collectively to FIGS. 1 and 3, manufacturing of a photovoltaic device 100, 200 generally includes sequentially disposing functional layers or layer precursors in a "stack" of layers through one or more processes, including, but not limited to, sputtering, spray, evaporation, molecular beam deposition, pyrolysis, closed space sublimation (CSS), pulse laser deposition (PLD), chemical vapor deposition (CVD), electrochemical deposition (ECD), atomic layer deposition (ALD), or vapor transport deposition (VTD). Once a layer is formed it may be desirable to modify the physical characteristics of the layer through subsequent treatment processes.

Figure 4:
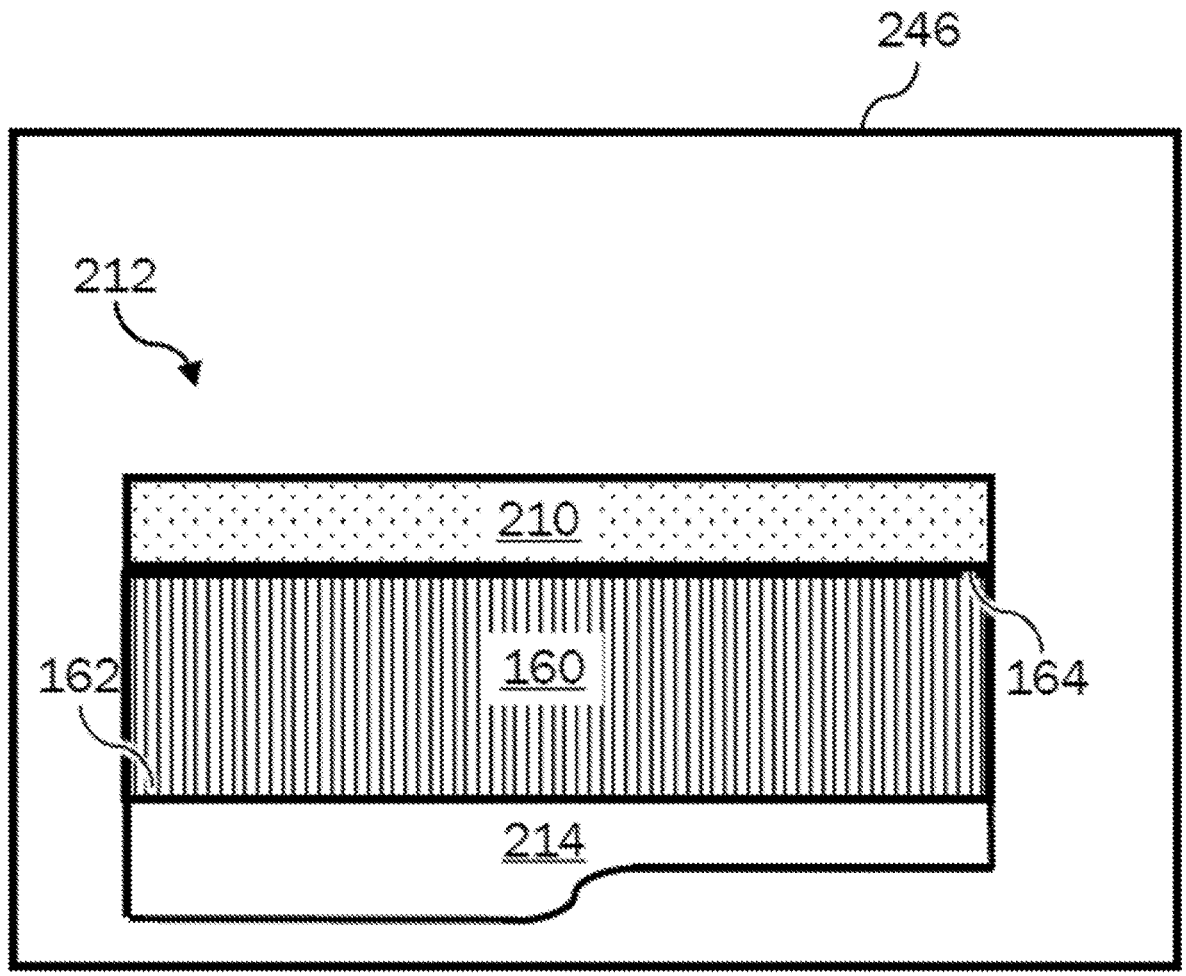
FIGS. 4 and 5 schematically depict partially formed photovoltaic devices according to one or more embodiments shown and described herein.
Figure 5:
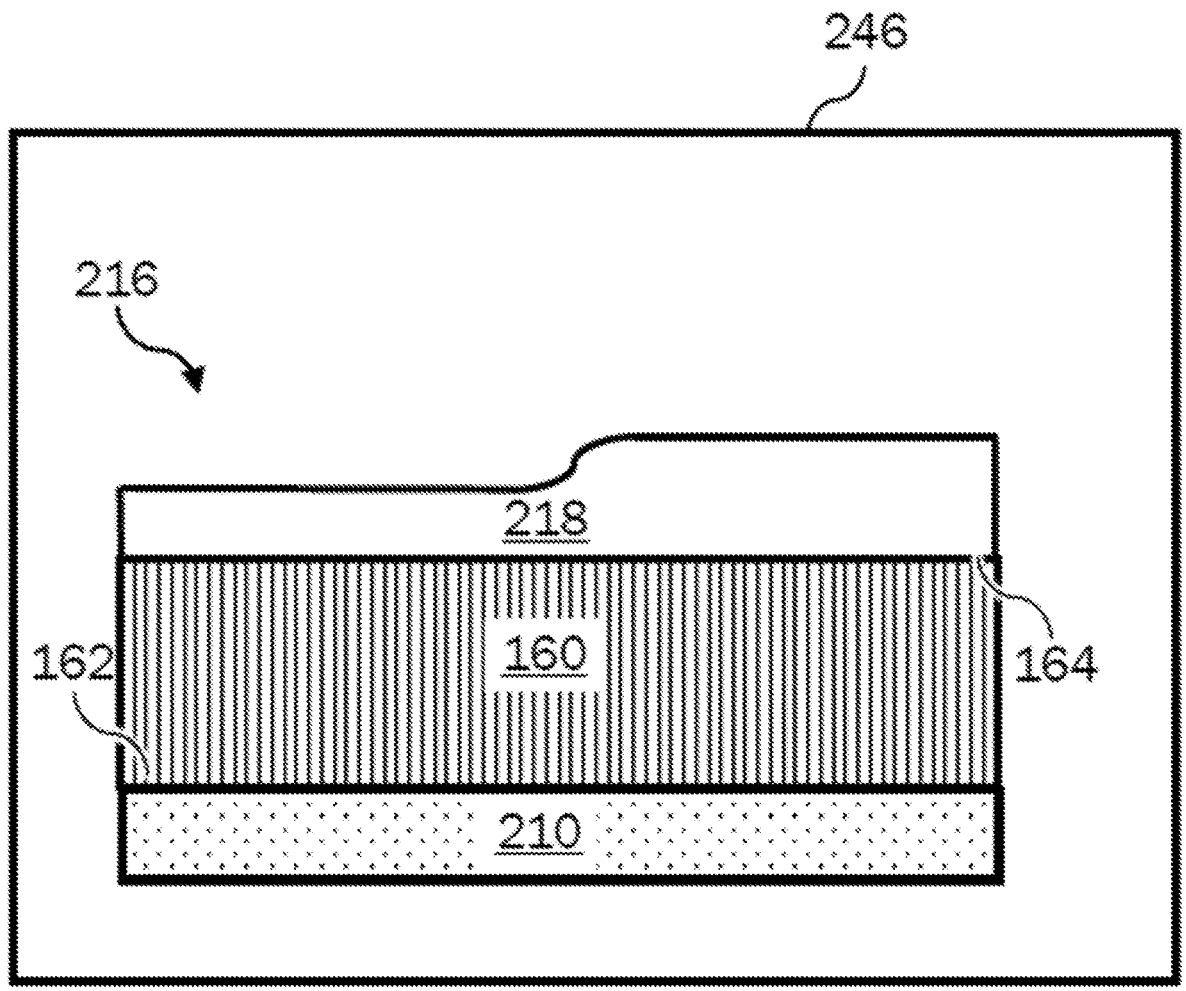

Referring collectively to FIGS. 4 and 5, a layer of annealing material 210 can be applied to the first surface 162 or the second surface 164 of the absorber layer 160 of a partially formed device. For example, a partially formed photovoltaic device 212 can comprise the absorber layer 160 adjacent to a layer stack 214. The layer stack 214 can include one or more of the layers of the photovoltaic device 100, 200 (FIGS. 1 and 3) disposed between the absorber layer 160 and the energy side 102. Alternatively, a partially formed photovoltaic device 216 can comprise the absorber layer 160 adjacent to a layer stack 218. The layer stack 218 can include one or more of the layers of the photovoltaic device 100, 200 (FIGS. 1 and 3) between the absorber layer 160 and the opposing side 104.

According to the embodiments provided herein, the annealing material 210 can be provided as a gel comprising cadmium chloride (CdCl$_2$) and a thickening agent. The thickening agent can be configured to control the viscosity of the gel. For example, the gel formed using cadmium chloride (CdCl$_2$) and the thickening agent can have a viscosity greater than or equal to about 5 millipascal seconds (mPa·s) such as for example, greater than or equal to about 5 millipascal seconds (mPa·s) and less than or equal to about 250 millipascal seconds (mPa·s) in one embodiment, or greater than or equal to about 10 millipascal seconds (mPa·s) and less than or equal to about 25 millipascal seconds (mPa·s) in another embodiment. Suitable thickening agents include, but are not limited to, Methyl Cellulose, Hydroxy- Propyl Methyl Cellulose, Corn Starch, Tapioca Starch, Guar Gum, Propylene Glycol, or any other material with comparable alkali content.

According to the embodiments provided herein, a ratio of cadmium chloride ($CdCl_2$) to thickening agent within the annealing material 210, on a weight basis in gel form, can be greater than or equal to 1 to 1 such as, for example, greater than or equal to about 1 to 1 and less than or equal to about 160 to 1 in one embodiment, greater than or equal to about 10 to 1 and less than or equal to about 30 to 1 in another embodiment. In other embodiments, such as, but not limited to thickening agents including Propylene Glycol, a ratio of cadmium chloride ($CdCl_2$) to thickening agent within the annealing material 210, on a weight basis in gel form, can be greater than or equal to about 0.1 to 1 such as, for example, greater than or equal to about 0.1 to 1 and less than or equal to about 2.5 to 1, in one embodiment.

Figure 6:
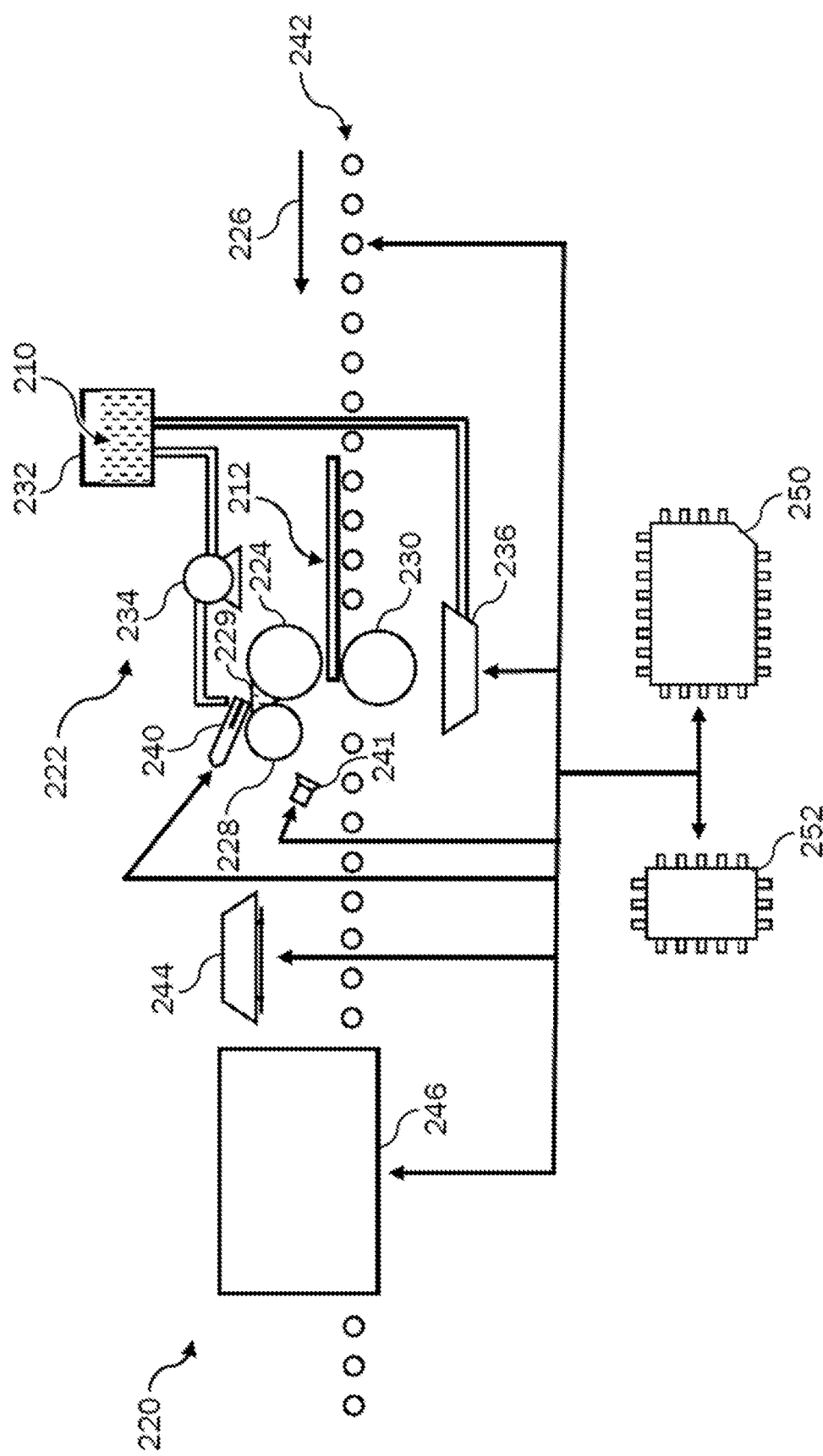
FIG. 6 schematically depicts a method for performing a solution based method for doping an absorber layer with group V dopants according to one or more embodiments shown and described herein.

Referring now to FIG. 6, a system 220 for applying the annealing material 210 to a partially formed photovoltaic device 212 is schematically depicted. The system 220 can include a roll coating apparatus 222 that is configured to apply a substantially uniform coating of a gel upon the partially formed photovoltaic device 212. It is noted that, while the present example is provided with respect to partially formed photovoltaic device 212, the system 220 can be used be used to apply a gel to the partially formed photovoltaic device 216. The roll coating apparatus 222 can include an application roller 224 for transferring the annealing material 210 to the partially formed photovoltaic device 212 as the partially formed photovoltaic device 212 is urged along a direction of conveyance 226. In some embodiments, the roll coating apparatus 222 can further include a doctor roller 228 and a counter pressure roller 230. A reservoir for holding the annealing material 210 can be bounded by the doctor roller 228 and the application roller 224. The reservoir 229 can be supplied with the annealing material via a holding tank 232. For example, the holding tank 232 can cooperate with one or more pumps 234 to urge the annealing material 210 via a flow path to the reservoir 229.

The pressure, spacing, or both of the doctor roller 228 relative to the application roller 224 can control the amount of the annealing material 210 that is transferred to the application roller 224. The surfaces of the doctor roller 228 and the application roller 224 may be smooth or textured and soft or hard. The surfaces of the doctor roller 228 and the application roller 224 need not be the same. For example, the doctor roller 228 can be compliant and textured, while the application roller 224 can be hard and smooth. Alternatively, the application roller 224 can be compliant and textured, while the doctor roller 228 can be hard and smooth. The counter pressure roller 230 can be configured to support the partially formed photovoltaic device 212 (e.g., from the energy side 102 (FIG. 1)) and urge the partially formed photovoltaic device 212 along the direction of conveyance 226.

According to the embodiments provided herein, the roll coating apparatus 222 can be configured to recirculate overflow of the annealing material 210 from the partially formed photovoltaic device 212. Specifically, the roll coating apparatus 222 can include a collector 236 positioned proximate to the partially formed photovoltaic device 212. In some embodiments, the collector 236 can be positioned beneath the application roller 224 and sized, relative the partially formed photovoltaic device 212, to receive the overflow of the annealing material 210 from the edges of the partially formed photovoltaic device 212. The overflow of the annealing material 210 captured by the collector 236 can be recirculated. For example, the one or more pumps 234 can urge the annealing material 210 via a flow path to the storage tank 232.

Referring still to FIG. 6, the system 220 can include a material sensor 240 for detecting the density of the annealing material 210. In some embodiments, the material sensor 240 can directly contact the annealing material 210. For example, the material sensor 240 can be positioned proximate the application roller 224 such as, for example, at the reservoir 229, or along a flow path of the annealing material 210. Alternatively or additionally, the material sensor 240 can be positioned at any location of the roll coating apparatus 222 such as, but not limited to, a flow path, the collector 236, the storage tank 232, or any combination thereof. The material sensor 240 can include any device that measures a physical quantity of the annealing material 210 and converts the detected quantity into a signal, which is indicative of the viscosity or density of the annealing material 210. It is noted that the term "signal" can mean a waveform (e.g., electrical, optical, magnetic, or electromagnetic), such as DC, AC, sinusoidal-wave, triangular-wave, square-wave, and the like, capable of traveling through a medium. Suitable examples of the material sensor 240 include viscometer, a tuning fork oscillator, a resonator, or the like.

According to the embodiments provided herein, the system 220 can include a metrology sensor 241 for detecting the thickness of the annealing material 210 applied to the partially formed photovoltaic device 212. In some embodiments, the metrology sensor 241 can be configured to measure the dimensions of the annealing material 210 without altering the dimensions of the annealing material. For example, the metrology sensor 241 can be positioned proximate the roll coating apparatus 222 and be configured to make non-contact measurements of the annealing material 210 upon application by the roll coating apparatus 222. The metrology sensor 241 can include any a device that measures a physical quantity of the annealing material 210 and converts the detected quantity into a signal, which is indicative of the dimensions of the annealing material 210. Accordingly, the metrology sensor can include sources and detectors configured for photometry, radiometry, or the like.

The system 220 can include a conveyance system 242 configured to urge the partially formed photovoltaic device 212 along a direction of conveyance 226. Generally, the conveyance system 242 can include support members such as, for example, rollers, belts or the like. Additionally, the conveyance system 242 can include one or more actuators configured to control the motion of the support members. The support members can be configured to communicate force from the one or more actuators to the partially formed photovoltaic device 212. Accordingly, the support members and the one or more actuators can cooperate to cause desired motion of the partially formed photovoltaic device 212.

Referring collectively to FIGS. 4, 5, and 6, the system 220 can include a film inducing heater 244 configured to transform the annealing material 210 from a gel to a film. The film inducing heater 244 can be positioned after the roll coating apparatus 222 along the direction of conveyance 226. The film inducing heater 244 can be a relatively low temperature heater configured to heat the annealing material 210 to by providing a zone or environment having a temperature greater or equal to about 85° C. such as for example, greater than or equal to about 90° C. and less than or equal to about 200° C. in one embodiment, or greater than or equal to about 100° C. and less than or equal to about 150° C. in another embodiment. Accordingly, the partially formed photovoltaic device 212, 216 can be heated to a temperature above 25° C. such as, for example, greater than or equal to about 30° C. and less than or equal to about 60° C. in one embodiment. The film inducing heater 244 can include any heating means such as, but not limited to, radiant infra-red, electric, fuel fired convection, forced air, or combinations thereof.

In some embodiments, the system 220 can include a processing chamber 246 configured to provide a pressure and temperature controlled environment to facilitate annealing of the absorber layer 160 using the annealing material 210. Generally, the processing chamber 246 can be positioned after the film inducing heater 244 and the roll coating apparatus 222, along the direction of conveyance 226. It is noted that, in some embodiments, the film inducing heater 244 can be omitted. In some embodiments, the processing chamber 246 can be configured to maintain a controlled pressure environment having a low vacuum pressure (between about 25 Torr to about 760 Torr) such as, for example, a range of about 200 Torr to about 800 Torr in one embodiment. Alternatively, the processing chamber 246 can be configured to maintain a pressure greater than ambient pressure, i.e., greater than about 760 Torr. Generally, the partial pressure of the constituent gases of the environment can be controlled. For example, in some embodiments, the partial pressures of any inert gases and reducing gases can be controlled. As used herein, a reducing gas can be energetically more favorable to oxidation than the dopants of the absorber layer 160, i.e., an oxidation reaction of the reducing gas can have a more negative Gibbs free energy change ($\Delta G$) than the dopant. Additionally, the processing chamber 246 can be configured to maintain an annealing temperature between about 350° C. and about 650° C.

According to the embodiments described herein, the system 220 can include one or more processors 250 communicatively coupled, which is generally depicted in FIG. 6 as double arrowed lines, to any of the functional components of the system 220. For example, the one or more processors 250 can be communicatively coupled to at least one of the roll coating apparatus 222, the material sensor 240, the metrology sensor 241, the conveyance system 242, the film inducing heater 244, and the processing chamber 246. As used herein, a processor can be any device capable of executing machine readable instructions. Accordingly, each of the one or more processors 250 may be a controller, an integrated circuit, a microchip, a computer, or any other computing means. The one or more processors 250 can be configured to execute logic or software and perform functions that control the functions of the system 220. Additionally, the one or more processors 250 can be communicatively coupled to memory 252, which can store the logic and/or input received by the one or more processors 250. The memory 252 described herein may be RAM, ROM, a flash memory, a hard drive, or any means of storing machine readable instructions.

Embodiments of the present disclosure comprise logic that includes machine readable instructions or an algorithm written in any programming language of any generation (e.g., 1GL, 2GL, 3GL, 4GL, or 5GL) such as, e.g., machine language that may be directly executed by the processor, or assembly language, object-oriented programming (OOP), scripting languages, microcode, etc., that may be compiled or assembled into machine readable instructions and stored on a machine readable medium. Alternatively, the logic or algorithm may be written in a hardware description language (HDL), such as logic implemented via either a field-programmable gate array (FPGA) configuration or an application-specific integrated circuit (ASIC), and their equivalents. Accordingly, the logic may be implemented in any conventional computer programming language, as pre-programmed hardware elements, or as a combination of hardware and software components. The logic can be configured such that, when executed by the one or more processors 250, the system 220 operates to automatically to move the partially formed photovoltaic device 212 and control the roll coating apparatus 222, the conveyance system 242, the film inducing heater 244, and the processing chamber 246. In some embodiments, the one or more processors 250 can receive signals from the material sensor 240, the metrology sensor, or both. Accordingly, the one or more processors 250 can automatically adjust parameters of the roll coating apparatus 222 to achieve the desired dosage such as, but not limited to, spacing between the application roller 224 and the doctor roller 228, pressure between the application roller 224 and the doctor roller 228, spacing between the application roller 224 and the partially formed photovoltaic device 212, pressure between the application roller 224 and the partially formed photovoltaic device 212, or speed of the partially formed photovoltaic device 212 relative to the between the application roller 224.

Figure 7:
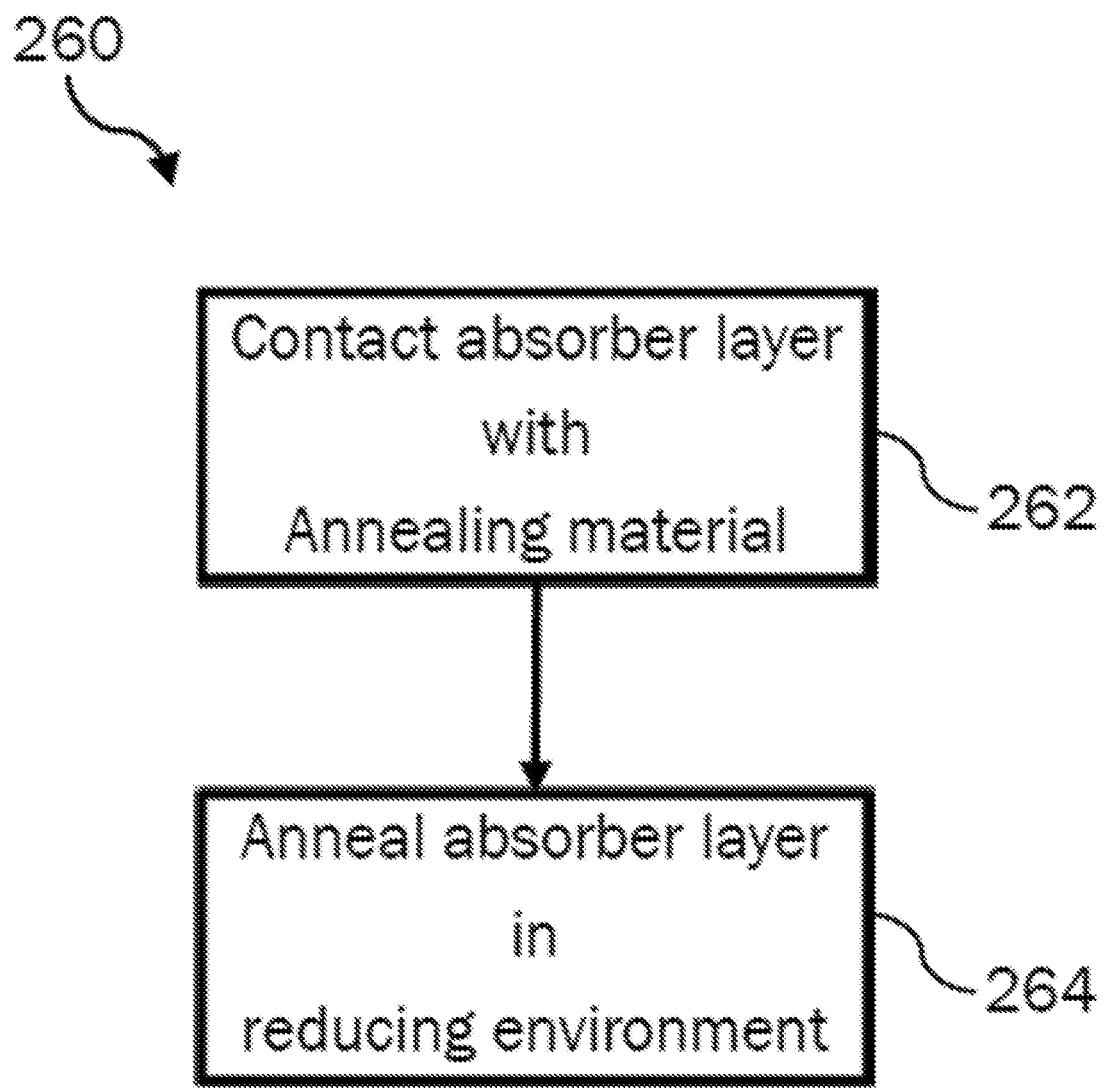
FIG. 7 depicts a method for annealing with an annealing material provided as a gel.

Referring now to FIG. 7, a method 260 for annealing with an annealing material 210 provided as a gel is depicted. Referring collectively to FIGS. 4, 5, 6, and 7, the method 260 can include a process 262 for contacting the absorber layer 160 with the annealing material 210. In some embodiments, the annealing material 210 can be applied to the first surface 162 or the second surface 164 of the absorber layer 160 as a gel. Specifically, the annealing material 210 can be roll coated upon the absorber layer 160 using the roll coating apparatus 222. For example, the annealing material 210 can be directly rolled, i.e., direct contact between the application roller 224 and the absorber layer 160, in one continuous layer. As is noted above, the viscosity of the gel of the annealing material 210 can be controlled. It is believed that directly rolling the annealing material 210 onto the absorber layer 160 can reduce the susceptibility of the second surface 164 or first surface 162 of the absorber layer to airborne impurities compared to a spray application.

In some embodiments, the annealing material 210 can be mixed into a solution that is transformed into the gel, prior to being roll coated upon the absorber layer 160 as a gel. For example, cadmium chloride ($CdCl_2$) and the thickening agent can be mixed together with water to form a solution. In some embodiments, the cadmium chloride ($CdCl_2$) and thickening agent can be mixed in dry form prior to adding the mixture to water to form a solution. Alternatively, the cadmium chloride ($CdCl_2$) and thickening agent can be added to the water, prior to intermixing to form the solution. In some embodiments, the solution of the annealing material 210 can be mixed at a mixing temperature that is higher than an application temperature of the gel of annealing material 210, i.e., the temperature of the solution can be higher than temperature of the gel during application. In some embodiments, the mixing temperature to application temperature can have a ratio of at least about 2 to 1.

Additionally, the density of the annealing material 210 can be maintained within a desired range. Specifically, the annealing material 210 can be measured using the material sensor 240. The measurement can be used to automatically determine whether the annealing material has a density within the desired range for application. If the density is acceptable, the annealing material can be applied to the absorber layer 160. Should the density be outside of the desired range, roll coating of the annealing material 210 can be ceased. In some embodiments, the gel is applied only if the density is measured within the desired range. Alternatively or additionally, the dosage of the annealing material con be controlled automatically using signals provided by the material sensor 240 and the metrology sensor 241. Without being bound to theory, it is believed that application of the annealing material 210 as a gel can improve containment of the cadmium chloride ($CdCl_2$) compared to liquid based application. Additionally, keeping the density of the annealing material 210 within the desired range, can improve average dose uniformity and transfer efficiency of the annealing material 210.

Referring collectively to FIGS. 4, 5, 6, and 7, the method 260 can include a process 264 for annealing the absorber layer 160 in the processing chamber 246. Generally, annealing includes heating the absorber layer 160 (e.g., polycrystalline semiconductor material) for sufficient time and temperature to facilitate re-crystallization of the absorber layer 160. For example, the absorber layer 160 can be processed at a temperature between about 350° C. and about 650° C. for between about 5 minutes and about 60 minutes such as, for example, at a temperature in a range of about 400° C. to about 600° C. for a duration of about 10 minutes to about 55 minutes, in one embodiment. In addition to recrystallization of the absorber layer 160, the presence of cadmium chloride ($CdCl_2$) and diffusion of chlorine into the absorber layer 160 can result in grain growth in the absorber layer 160, i.e., an increase in the gran size of the absorber layer 160.

Optionally, the annealing material 210 can be dried into a substantially continuous film prior to annealing the absorber layer 160. For example, the annealing material 210 can be heated by the film inducing heater 244 to transform from a gel into a film. In some embodiments, the thickening agent can operate to bond the annealing material 210 together and bond the annealing material 210 to the absorber layer 160. Accordingly, film formation can further enhance containment of the cadmium chloride ($CdCl_2$) compared to applications that do not use the thickening agent, which can instead generate a more powdery cadmium chloride ($CdCl_2$) layer. In some embodiments, a ratio of cadmium chloride ($CdCl_2$) to thickening agent within the film of the annealing material 210, on a weight basis, can be greater than or equal to 0.1 to 1 such as, for example, greater than or equal to about 1 to 1 and less than or equal to about 160 to 1 in one embodiment, greater than or equal to about 10 to 1 and less than or equal to about 30 to 1 in another embodiment.

Moreover, the dosage of the film of the annealing material 210 can be controlled, i.e., by adjusting components of the roll coating apparatus 222 based upon signals provided by the material sensor 240, the metrology sensor 241, or both. The desired range for the dosage of the film of the annealing material 210 can be greater than or equal to about 0.15 mg/cm² such as, for example, greater than or equal to about 0.16 mg/cm² and less than or equal to about 1.20 mg/cm² in one embodiment, greater than or equal to about 0.175 mg/cm² and less than or equal to about 0.5 mg/cm² in another embodiment, or greater than or equal to about 0.175 mg/cm² and less than or equal to about 0.25 mg/cm² in a further embodiment.

It should now be understood that the embodiments provided herein relate to annealing gels and methods for annealing an absorber layer with the annealing gels. The annealing gels can be sued to improve the overall annealing process compared to alternative cadmium chloride ($CdCl_2$) materials. For example, per unit volume of cadmium chloride ($CdCl_2$), the annealing gel can cover about 25% more absorber surface area compared to a spray solution. Additionally, the annealing gel based methods described herein can form substantially more uniform layers of annealing material upon a surface of an absorber layer. Testing demonstrated an improvement of about 35% in the coefficient of variation (CV) of the layer thickness of the annealing material roll coated as a gel compared to the layer thickness of the annealing material sprayed as a solution. Moreover, the annealing material demonstrated greater coverage of the layer with cadmium chloride ($CdCl_2$) using the gel based methods described herein. Specifically, surface images of a sprayed solution demonstrated less cadmium chloride ($CdCl_2$) coverage (percent of pixels of corresponding to cadmium chloride ($CdCl_2$)) displayed at a 100 μm scale than a comparative sample of the roll coated gel displayed at a 10 μm scale. Accordingly, the lower resolution images (100 μm scale) captured more voids per image element than the higher resolution images (10 μm scale), which corresponds to more and larger voids for the sprayed solution compared to the roll coated gel.

According to the embodiments of the present disclosure, a method for annealing an absorber layer can include contacting a surface of the absorber layer with an annealing material provided as a gel. The absorber layer can include cadmium and tellurium. The annealing material can include cadmium chloride and a thickening agent. A viscosity of the gel of the annealing material can be greater than or equal to 5 millipascal seconds. The method can include annealing the absorber layer with the annealing material in contact with the surface of the absorber layer.

In some embodiments, a gel of annealing material can include cadmium chloride and a thickening agent. The viscosity of the gel of the annealing material can be greater than or equal to 5 millipascal seconds.

According to the embodiments provided herein, a partially formed photovoltaic device can include an absorber layer and a film of annealing material. The absorber layer can include cadmium and tellurium. The film of annealing material can be directly in contact with a surface of the absorber layer. A dosage of the film of the annealing material can be greater than or equal to 0.15 mg/cm². The film of the annealing material can include cadmium chloride and a thickening agent. A ratio of the cadmium chloride to the thickening agent in the film of the annealing material, by weight, can be greater than or equal to 0.1 to 1.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method for treatment of an absorber layer on a layer stack for a photovoltaic device, comprising:
preparing an annealing material comprising cadmium chloride and a thickening agent,
wherein:

a ratio of the cadmium chloride to the thickening agent in the annealing material is in a range from 1:1 to 160:1, by weight;

the thickening agent comprises at least one of Methyl Cellulose, HydroxyPropyl Methyl Cellulose, or Propylene Glycol; and the annealing material has a viscosity in a range of 5 to 250 millipascal seconds;

applying a substantially uniform coating of the annealing material to a surface of the absorber layer, wherein the absorber layer comprises cadmium and tellurium, and the absorber layer is doped with a group V dopant;

forming a film having area density in a range of 0.15 mg/cm$^2$ to 1.20 mg/cm$^2$ by drying the annealing material applied to the absorber layer; and processing the absorber layer with the film in contact with the surface of the absorber layer, at an annealing temperature in a range of 350° C. to 650° C. for between 5 minutes and 60 minutes.

2. The method of claim 1 wherein forming the film further comprises:

exposing the annealing material on the absorber layer to a temperature in a range of 25' C to 200° C.

3. The method of claim 1, comprising: measuring the gel of the annealing material with a material sensor; communicating a signal to one or more processors communicatively coupled to the material sensor, wherein the signal is indicative of the viscosity of the gel of the annealing material; and determining, automatically with the one or more processors, the density of the gel of the annealing material, wherein the surface of the absorber layer is contacted when the viscosity of the gel of the annealing material is greater than or equal to 5 millipascal seconds.

4. The method of claim 1, comprising roll coating the surface of the absorber layer with the annealing material, wherein the surface of the absorber layer is directly contacted with an application roller.

5. The method of claim 4, comprising: capturing overflow of the gel of the annealing material from the absorber layer and recirculating the gel of the annealing material that is captured to the application roller.

6. The method of claim 1, wherein the step of forming a film comprises transforming the gel of the annealing material into a film of the annealing material by heating the gel of the annealing material, prior to annealing the absorber layer.

7. The method of claim 6, wherein the gel is heated to a temperature greater than or equal to 30° C. and less than or equal to 60° C.

8. The method of claim 1, comprising: mixing a solution of the annealing material at a mixing temperature; and transforming the solution of the annealing material into the gel of the annealing material, before the surface of the absorber layer is contacted with the gel of the annealing material, wherein: the gel of the annealing material is at an application temperature, and the application temperature is less than the mixing temperature.

9. The method of claim 1, comprising exposing the absorber layer to a reducing environment, while the absorber layer is annealed.

10. The method of claim 1, wherein the thickening agent is Methyl Cellulose.

11. The method of claim 1, wherein the thickening agent is HydroxylPropyl Methyl Cellulose.

12. The method of claim 1, wherein the thickening agent comprises Propylene Glycol, and wherein a ratio of the cadmium chloride to the Propylene Glycol in the gel of the annealing material, by weight, is greater than or equal to 1 to 1, and equal to or less than 30 to 1.

* * * * *